United States Patent
Wach (10) Patent No.: US 6,496,523 B1
(45) Date of Patent: Dec. 17, 2002

(54) OPTICAL FEEDBACK ASSEMBLY

(75) Inventor: Michael L. Wach, Atlanta, GA (US)

(73) Assignee: Cirrex Corp., Atlanta, GA (US)

( * ) Notice: Subject to any disclaimer, the term of this patent is extended or adjusted under 35 U.S.C. 154(b) by 0 days.

(21) Appl. No.: 09/579,297

(22) Filed: May 25, 2000

Related U.S. Application Data (60) Provisional application No. 60/135,875, filed on May 25, 1999.

(51) Int. Cl.$^7$ ................................................ H01S 3/13
(52) U.S. Cl. ............................. 372/32; 372/20; 372/98
(58) Field of Search ........................... 372/29, 32, 28, 372/20, 98, 6

(56) References Cited

U.S. PATENT DOCUMENTS

| | | | | |
|---|---|---|---|---|
| 4,693,544 A | * | 9/1987 | Yamasaki et al. | ......... 350/96.16 |
| 5,305,336 A | * | 4/1994 | Adar et al. | ..................... 372/6 |
| 5,521,733 A | | 5/1996 | Akiyama et al. | |
| 5,917,623 A | | 6/1999 | Yoshida | |
| 5,974,207 A | * | 10/1999 | Askuk et al. | .................. 385/24 |
| 6,219,474 B1 | * | 4/2001 | Cai et al. | ....................... 385/24 |

FOREIGN PATENT DOCUMENTS

| | | |
|---|---|---|
| EP | 0 611 097 A1 | 8/1994 |
| JP | 60217315 | 10/1985 |
| JP | 61282803 | 12/1986 |
| JP | 63060410 | 3/1988 |
| JP | 02034806 | 2/1990 |
| JP | 10-327128 | 12/1998 |
| WO | WO 97/06616 | 2/1997 |
| WO | WO 99/21316 | 4/1999 |
| WO | WO 00/72416 A1 * | 11/2000 |
| WO | WO 00/72491 A2 * | 11/2000 |

OTHER PUBLICATIONS

Patent abstracts of Japan vol. 010, No. 080 (P–441), Mar. 29, 1986 & JP 60 217315, Oct. 30, 1985.
Patent abstracts of Japan vol. 012, No. 280 (P–739), Aug. 2, 1988 & JP 63 060410 Mar. 16, 1988.
Patent abstracts of Japan vol. 011, No. 144 (P–574), May 12, 1987 & JP 61 282803, Dec. 13, 1986.
Patent abstracts of Japan vol. 014, No. 189 (P–1037), Apr. 17, 1990 & JP 02 034806 Feb. 5, 1990.
Kahn J. M. et al., "High–Stability 1.5M External–Cavity Semiconductor Lasers for Phase–Lock Application" IEEE Photonic Technology Letters, US, IEEE Inc. New York, vol. 1, No. 7, Jul. 1, 1989, pp. 159–161, XP000053582 ISSN: 1041–1135 the whole document.

(List continued on next page.)

Primary Examiner—Leon Scott, Jr.
(74) Attorney, Agent, or Firm—King & Spalding

(57) ABSTRACT

An optical feedback assembly includes a filter and a partial reflector that can stabilize and center the optical output of a laser on a specific wavelength region. The partial reflector, such as a half mirror, can be placed adjacent to the laser while the filter can be disposed between the partial reflector and the laser. Because of its relative location to the lasing cavity of a laser, the optical feedback assembly may be characterized as form of "external cavity feedback" for the laser. The optical feedback assembly is well suited for optical networks in general and for dense wavelength division multiplexing applications.

61 Claims, 6 Drawing Sheets

OTHER PUBLICATIONS

Clarke R. H., "Fields in Extended Cavity Lasers", IEEE Journal of Quantum Electronics, US, IEEE Inc., New York vol. 24, No. 5, May 1, 1988, pp. 833–842, XP000706012 ISSN: 0018-9197 figure 1.

Bernacki B. E. et al., "Alignment–Insensitive Tehcnique for Wideband Tuning of an Unmodified Semiconductor Laser" Optics Letters, US, Optical Society of America, Washington, vol. 13, No. 9, Sep. 1, 1988, pp. 725–727 XP000710590 ISSN: 0146-9592 figure 1.

Corzine S.W. et al., "Actively Mode–Locked Gain As P Laser With Subpicosecond Output" Applied Physics Letters, American Institute of Physics, New Your, US, vol. 52 No. 5, Feb. 1, 1988, pp. 348–350, XP000706598, ISSN: 0003-6951, p. 348, paragraph 3; figure 1.

Heismann et al., "Electrooptically Tunable Narrow–Linewidth INGAASP–TI:LINB03 Extended Cavity Laser," Optical Fiber Communication Conference., (OFC), US, New York, IEEE, vol. Conf. 10, Jan. 19, 1987, p. 149, XP000713166, ISBN: 0–936659–41–6, The whole Document.

International Search Report dated Oct. 16, 2000 for International Application No. PCT/US 00/14571, for application entitled "Optical Feedback Assembly", filed on May 25, 2000.

Partial International Search dated Oct. 19, 2000 for International Application No. PCT/US 00/14567, for application entitled "Method and System for Increasing the Number of Information Channels Carried by Optical Waveguides," filed on May 25, 2000.

International Search Report dated Jul. 28, 2000 for International Application No. PCT/US 00/06868, for application entitled "Optical Network Assembly," filed on Mar. 15, 2000.

Tachikawa Y., et al., "Arrayed–Waveguide Grating Multiplexer with Loop–Back Optical Paths and its Applications," *Journal of Lightwave Technology*, IEEE, New York, US, vol. 14, No. 6, (Jun. 1, 1996), pp. 977–984, XP000598501, ISSN: 0733-8724, abstract, parts II, III, IV and V. A.*

* cited by examiner

OPTICAL FEEDBACK ASSEMBLY

STATEMENT REGARDING RELATED APPLICATIONS

This application is related to U.S. application Ser. No. 09/578,777, entitled "Method and System for Increasing a Number of Information Channels Carried by Optical waveguides," filed May 25, 2000 and claims benefit of priority to U.S. Provisional Application No. 60/135,875, entitled, "Optical Feedback Assembly," filed May 25, 1999.

TECHNICAL FIELD

This invention relates generally to optical networks. More particularly, the present invention relates to stabilizing light output of a laser device for producing light energy within an optical network.

BACKGROUND OF THE INVENTION

Conventional lasers typically output unstabilized monochromatic light energy that has multiple spectral modes and that has more than one predefined wavelength region. The unstable light energy can be attributed to phenomena such as multiple longitudinal modes within the gain region of the lasing cavity, mode-hopping, drift, instability, and spontaneous emissions. These phenomena can be a dependent on the mechanics or physical configuration of a laser. Other phenomena which may negatively influence the light output of the conventional laser include the following: indeterminate back reflections of light into a laser cavity of the primary laser wavelength; unwanted or interfering light propagating at non-laser wavelengths entering into a lasing cavity; temperature instability; and manufacturing variations of the laser and associated optical components.

Numerous conventional architectures have been manufactured to spectrally control a laser device's output. However, these conventional laser device architectures typically require large or bulky and optically inefficient components that may be subject to environmental elements. Some conventional laser device architectures require moving parts that can produce highly undesirable mechanical motions. Additionally, conventional laser device architectures that attempt to stabilize laser light output of the a laser device are usually permanently attached to the laser device. The conventional laser device architecture is simply not designed to be changeable or easily replaced.

As noted above, undesirable light at non-laser wavelengths can enter a laser cavity and significantly and negatively affect the output of the laser device. In other words, unwanted light at non-laser wavelength entering a laser cavity can substantially degrade the spectral purity of a laser device's output.

Accordingly, a need in the art exists for a method and apparatus that can stabilize laser light output in addition to blocking any back reflections of light that may try to enter into a laser cavity. Another need exists in the art for a method and apparatus for stabilizing light output of a laser device. More specifically, there is a need in the art for an optical feedback assembly that can be utilized with conventional or existing laser devices. An additional need in the art exists for a method, and apparatus for stabilizing laser output that is readily detachable or replaceable as a field-configurable unit. There is also a need in the art for a method and apparatus that can stabilize laser light output where an optical configuration providing such a function has a unitary structure.

SUMMARY OF THE INVENTION

The present invention can solve the problems of conventional laser devices by providing an optical feedback assembly that comprises a filter and a partial reflecting device that can stabilize and center the optical output of a laser on a specific wavelength region. The partial reflecting device, such as a mirror, can be placed adjacent to the laser while the filter can be disposed between the partial reflecting device and the laser. Because of its relative location to the lasing cavity of a laser, the optical feedback assembly may be characterized as form of "external cavity feedback" for the laser. The optical feedback assembly is well suited for optical networks in general and for dense wavelength division multiplexing applications.

The filter of an optical feedback assembly can be designed to pass only a predetermined wavelength region of light energy. In one aspect of the invention, the filter can be a thin film interference filter. After light energy having the predetermined wavelength region passes through the filter, it can be reflected by the partial reflecting device back into a lasing cavity of a laser so that the laser can "lock on" to the predetermined wavelength region. In other words, the light energy having the predetermined wavelength region reflected by the partial reflecting device into the lasing cavity can permit the laser to output light energy centered on the predetermined wavelength region.

The optical feedback assembly can be designed to work with conventional lasers, such as off-the-shelf semiconductor lasers. The optical feedback assembly can enhance the output of such conventional lasers. For example, conventional lasers, such as Fabry-Perot diode lasers, typically produce light energy that is monochromatic and exhibits multiple modes at numerous wavelength regions. When coupled to the inventive optical feedback assembly, the output of a conventional laser can be adjusted such that the laser produces highly monochromatic light energy at a predetermined wavelength region. The optical feedback assembly can achieve these results at very low cost and with little or no modification to the conventional laser itself since the optical feedback assembly can be readily attached to the laser.

The optical feedback assembly can be formed into an integrated optics package. That is, the filter and the partial reflecting device can form a single or unitary construction. Each integrated optics package can be easily disposed within an optical waveguide or at an end portion of an optical waveguide to form field configurable stubs. In other words, each optical feedback assembly can be integrally formed within or attached to small optical waveguides that can be easily coupled to conventional lasers. Such construction permits rapid and cost efficient replacement or switching of parts.

For example, in order to change the operating wavelength region of a conventional laser, all that may be needed is a stub having an optical feedback assembly designed to filter and reflect light energy at a different wavelength region. On the other hand, conventional laser technology requires rather complex optics and electronics and physical manipulation of the lasing cavity to achieve different wavelength regions of laser light output. With the present invention, however, an existing stub filtering and reflecting light energy at a first wavelength region can be replaced by a stub that filters and reflects light energy at a second wavelength region different from the first wavelength region.

According to another aspect of the present invention, the optical feedback assembly may further comprise an antireflective coating that can be disposed on a front or output facet of a lasing cavity of a laser. Conventional lasing cavities of lasers typically have reflective characteristics for output facets in order to permit lasing. With the present invention, an anti-reflective coating disposed on the output facet of the lasing material permits a laser to enhance its output by more readily "locking on" to the light energy of a predetermined wavelength region reflected by the partial mirror.

For another aspect of the present invention, the optical feedback assembly may comprise a grating instead of a thin film interference filter. More specifically, the optical feedback assembly may comprise a Bragg grating in combination with an optical waveguide. The Bragg grating may be disposed within or adjacent to an optical waveguide. Because light energy can be waveguided within a Fiber-Bragg grating, this optical feedback assembly can produce very efficient laser light output at predefined wavelength region regions.

In another aspect of the present invention, the optical feedback assembly may further comprise a guard-band filter disposed outside of or on an opposite side of a Bragg grating. The guard-band filter can prevent light energy of undesired wavelength region regions from passing through the Bragg grating into the lasing material of the laser. In other words, the guard band filter can prevent signals generated by a network from propagating back through the Bragg grating into the lasing cavity.

DETAILED DESCRIPTION OF EXEMPLARY EMBODIMENTS

With the present invention, an optical feedback assembly can stabilize and center the optical output of the laser on a specific wavelength region. It is noted that a "wavelength region" can be defined as a span of wavelengths that is adjacent or approximate to a specific wavelength. In other words, a wavelength region of $\lambda_1$ can include neighboring wavelengths of a desired threshold. For example, if it is desirable to have a threshold of one-fourth the wavelength region of $\lambda_1$, such a wavelength region could encompass wavelengths that are 0.25 below and above the central wavelength of $\lambda_1$. The threshold of a wavelength region can be adjusted depending upon the application of the present invention.

Because of its relative location to the lasing cavity of a laser, the optical feedback assembly of the present invention may be characterized as a form of "external cavity feedback" for the laser device. The optical feedback assembly is well suited for optical network applications in general and specifically, for dense wavelength region division multiplexing applications. The optical feedback assembly can be designed to work with conventional lasers, such as of-the-shelf semi-conductor lasers. When coupled to the inventive optical feedback assembly, the output of a conventional laser can be adjusted so that the laser produces highly monochromatic energy at a pre-determined wavelength region.

Further, the optical feedback assembly can be formed into an integrated optics package. That is, the filtering device and partial reflecting device of the optical feedback assembly can for a single or unitary construction. Each integrated optics package can be easily disposed within an optical waveguide or at an end portion of an optical waveguide to form field configurable stubs. According to another aspect of the present invention, the optical feedback assembly may further comprise an anti-reflective coating that can be disposed on a front or opposite facet of a lasing cavity of a laser. In another aspect of present invention, the optical feedback assembly may further comprise a guard band filter disposed outside of a Bragg grating.

Referring now to the drawings, in which like numerals represent like elements through several figures, aspects of the present invention in the preferred operating environment will be described.

Figure 1:
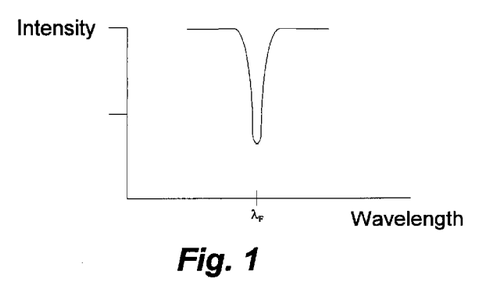
FIG. 1 is a graph of transmission intensity versus wavelength illustrating exemplary spectral aspects of a filtering device according to an embodiment of the present invention.

FIG. 1 is a graph of transmission intensity versus wavelength that illustrates exemplary spectral characteristics of a filtering device that forms a part of the optical feedback assembly of the present invention. FIG. 1 illustrates that light energy having a pre-determined wavelength region of $\lambda_F$ passes through the filtering device so that the laser device of the present invention will ultimately output light energy at this pre-determined wavelength region of $\lambda_F$.

Figures 2, 3A, 3B, 3C:
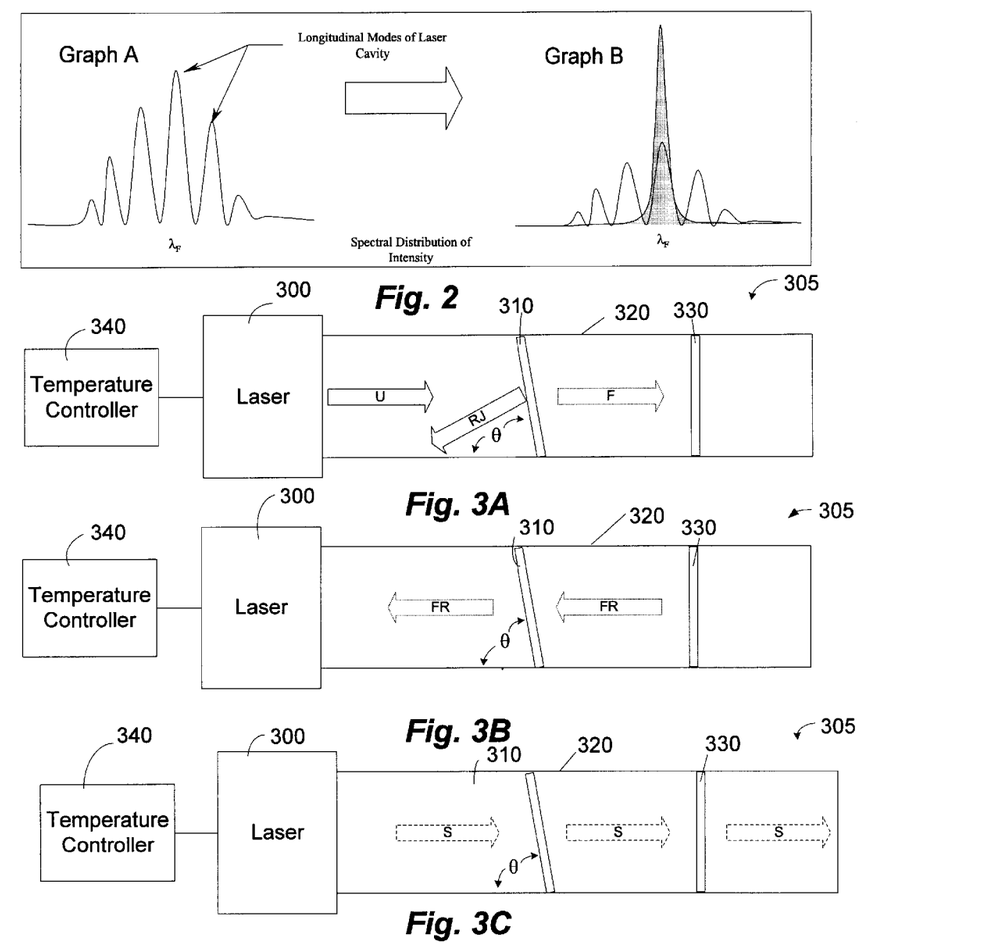
FIG. 2 illustrates exemplary laser output before and after an optical feedback assembly according to an embodiment of the present invention is coupled to a laser.
FIG. 3A is a diagram illustrating an exemplary optical feedback assembly of the present invention and one stage of the light energy feedback process.
FIG. 3B illustrates the exemplary optical feedback assembly of FIG. 3A at another stage of the light energy feedback process.
FIG. 3C illustrates an exemplary optical feedback assembly of FIG. 3A at a further stage of the light energy feedback process.

FIG. 2 illustrates exemplary laser output of a conventional laser device before and after the optical feedback assembly according to an exemplary embodiment of the present invention has been coupled to a laser device. Graph A of FIG. 2 illustrates relative intensity versus wavelength of an exemplary conventional laser device prior to the feedback signal generated by the present invention. Graph A illustrates the longitudinal modes of the lasing region that define the spectral characteristics of the unstabilized light energy output for a conventional laser device prior to feedback. On the other hand, Graph B of FIG. 2 represents relative intensity versus wavelength where mode control can be achieved by the feedback signal generated by present invention period. Graph B of FIG. 2 further represents the stabilized monochromatic light energy having a pre-determined wavelength region of $\lambda_F$. Such a laser device output as illustrated in Graph B of FIG. 2 is well suited for optical networks in general and for dense wavelength division multi-plexing (DWDM) applications.

FIG. 3A illustrates an exemplary optical feedback assembly 305 of the present invention at an initial stage during the optical feedback process. Specifically, laser device 300 first produces or generates unstabilized and monochromatic light energy U. The unstabilized monochromatic light energy having wavelength regions outside of the predetermined wavelength region $\lambda_F$ are rejected or reflected at an angle away by filtering device 310. The filtering device 310 is disposed within an optical waveguide 320 at an angle theta ($\theta$) relative to a longitudinal axis of the optical waveguide 320. The optical waveguide 320 is but a part of an optical pathway that extends through a semiconductor gain medium or lasing cavity (not shown) and provides communication with the filtering device 310 and a partial reflecting device 330. The filtered or stabilized light energy having a wavelength region of $\lambda_F$ propagates through the filtering device 310 and towards the partial reflecting device 330. In FIG. 3B, the partial reflecting device 330 reflects or re-directs the light energy FR back towards the laser device 300 through the filtering device 310.

In FIG. 3C, the laser device 300 "locks" on to the stabilized and filtered reflective light energy FR to produce stabilized light energy having a pre-determined wavelength of $\lambda_F$. The highly stabilized monochromatic light energy produced by laser device 300 passes again through the filtering device 310 and through the partial reflecting device 330. The light energy output of the laser device 300 can be further enhanced by the temperature controller 340.

With the temperature controller 340, the temperature of the laser device 300 can be reset so as to minimize the pull or energy required between the old and new wavelength regions of the laser device 300. For this capability, a field-configurable temperature adjustment mechanism can be included with the temperature controller 340. One method of optimizing the performance of the feedback assembly, whether during a channel reconfiguration or during initial installation, is to spectrally monitor the uncontrolled output of the laser device while adjusting the temperature set point of the temperature controller 340. In this manner, the temperature to produce stabilized laser light energy can be set so that the temperature controller 340 and the laser device 300 work together to increase system performance.

The filtering device 310 is preferably a thin-film dielectric interference filter that is sometimes referred to in the art as a "band pass" filter. The filtering device 310 is preferably comprised of layers of materials with a packing density 95% and more preferably, a packing density exceeding 99%. The filtering device 310 can have a first contiguous spectral region for propagating a first predetermined wavelength region of light energy therethrough and for reflecting second and third predetermined wavelength regions of the light energy away from the filtering device 310. The term "contiguous" means that the frequency or wavelength characteristics of an output signal of a device are smooth and do not have any sharp, relative transitions. The first wavelength region can be spectrally disposed between the second and third predetermined wavelength regions, similar to the modes illustrated in Graph B of FIG. 2. The partial reflecting device 330 can have a second contiguous spectral region, as will be discussed below.

Since the filtering device 310 is disposed at an angle theta ($\theta$) with respect to the longitudinal axis of the optical waveguide 320, the rejected light RJ is directed outside of the angular propagation limits of the optical waveguide 320. Consequently, the rejected light RJ does not re-enter the laser device 300. The angle theta ($\theta$) of the filtering device 310 should be chosen so as to permit the desired light energy propagating at the predetermined wavelength region $\lambda_F$ to pass with minimal losses through the filtering device 310 while the undesirable light energy is reflected outside the propagation limits of the optical waveguide 320. In an exemplary embodiment, the angle theta ($\theta$) is an oblique angle. That is, the angle theta ($\theta$) is less than or greater than ninety degrees relative to a longitudinal axis of the optical waveguide 320.

The filtering device 310 of the present invention is not limited to thin-film dielectric interference filters. Other filtering devices include, but are not limited to, the following: notch reflectors comprised of adjacent regions of alternating refractive index materials; architectures based on holographic filters; fiber Bragg gratings; thin-film stacks of high-low alternating refractive index layers configured to form a noch reflector; and interference architectures based on Fabry-Perot Etalons or Mach-Zender.

For a filtering device 310 that may comprise one or more thin-film stacks of high-low alternating refractive index layers, the refractive index change between the layers can be gradual and not step changed so as to provide a rugate filter architecture. The layers of this alternative embodiment should be comprised of a high packing density, preferably exceeding 95% and more preferably, a packing density exceeding 99%. The preferred refractive index differential between materials should be high enough so as to minimize the thickness of the filter stack. To this end, silicon- and carbon-based films can be used to comprise the high refractive index layers of this filtering device embodiment. Oxide materials can also be used to construct the filtering device 310.

The sum of the length of the bands of alternating refractive index materials of the thin film alternating refractive index embodiment of the filtering device 310 is preferably less than 250 microns. With this alternate exemplary embodiment, the filtering device 310 can provide narrow-band reflection less than two nanometers FWHM along an optical path summing less than one millimeter in length. Alternatively, the alternating refractive index material embodiment of the filtering device 310 can provide a narrow band reflection less than one millimeter FWHM along an optical pass summing than 500 microns in length. For an optical path summing less than 200 microns in length, an alternating refractive index band embodiment of the filtering device 310 can provide narrow-band reflection less than 0.5 nanometer FWHM.

For optical paths, summing less than 50 microns in length, the alternating refractive index band embodiment of the filtering device 310 can provide a narrow-band reflection of less than 0.5 nanometer FWHM. Also, for optical paths summing less than 20 microns in length, the alternating refractive index band embodiment of the filtering device 310 can provide a narrow band reflection less than 0.5 nanometer FWHM. Similarly, for an optical path summing less than 50 microns in length, the alternating refractive index band embodiment of the filtering device 310 can provide a narrow-band reflection of less than 0.2 nanometer FWHM.

Partial reflecting device 330 is preferably made of a semi-transparent or semi-reflective layer of metal, such as gold. The partial reflecting device 330 may be achieved by depositing an extremely thin layer of metal, or may be achieved with mask techniques. The partial reflecting device 330 may be comprised of dielectric layers so that reflection is achieved by thin-film interference. In an exemplary embodiment, the partial reflecting device 330 can have second contiguous spectral region (relative to the first spectral region of filtering device 310) for reflecting a first portion of incident light energy and for transmitting a second portion of the incident light energy.

The second spectral region of the partial reflecting device 330 preferably includes the first spectral region of the filtering device 310. The partial reflecting device 330 can be positioned within an optical pathway at a substantially perpendicular angle relative to a longitudinal axis of the optical pathway so that maximum reflection of the filtered light energy can occur. In other words, in the exemplary embodiment, the partial reflecting device 330 is substantially perpendicular to a longitudinal axis of the optical waveguide 320.

Since the angled filtering device 310 directs light energy having wavelength regions outside of the predetermined wavelength region back towards the laser device 300 but into the cladding of the optical waveguide 320, it may be desirable to minimize the amount of light energy that may reenter the laser device 300. One way to minimize the rejected light energy RJ from the reentering the laser device 300 is to mask a non-active portion of an end face of the optical waveguide 320 that is adjacent to the laser device 300 so that an aperture (not shown) is formed. Alternatively, this aperture (not shown) may be positioned between an active laser facet of the laser device 300 and an end face of the optical guide 320.

In addition to filtering the unstabilized monochromatic light energy of the laser device 300, the filtering device 310 also provides a guard band function. In other words, the filtering device 310 can reflect undesired wavelength regions of monochromatic light energy with a side opposite to the laser device 300. That is, the side of the filtering device facing the partial reflecting device 330 can prevent undesired wavelength regions of monochromatic light energy from propagating towards or into the laser device 300.

FIG. 3 illustrates an optical feedback assembly 305 that results in narrow-band reflection preferably less than 0.3 nanometer full-with half-mean (FWHM) with a band of alternating refractive index materials along an optical path summing less than fifteen microns in length. The optical feedback assembly 305 can be manufactured as a relatively small assembly that may be less than 100 grams in mass.

Figure 4:
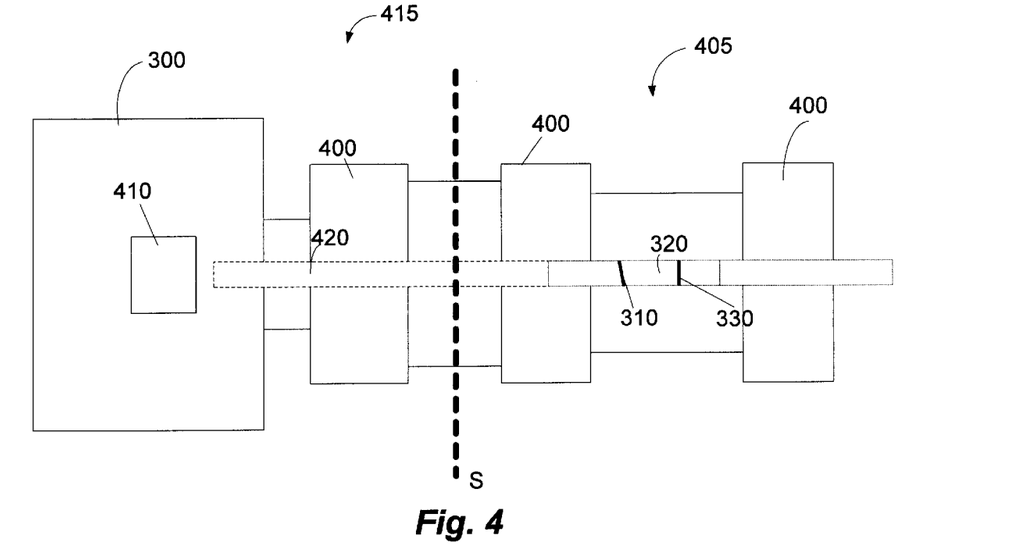
FIG. 4 illustrates an optical feedback assembly according to one exemplary embodiment of the present invention where the optical feedback assembly is positioned within an optical waveguide to form a field-configurable assembly.

FIG. 4 illustrates an optical feedback assembly 305 according to one exemplary embodiment of the present invention where the optical feedback assembly 305 is positioned within an optical waveguide 320. The light energy having the predetermined wavelength region reflected by the partial reflecting device 330 into the lasing cavity 410 can permit the laser device 300 to output light energy centered on a predetermined wavelength region. In this embodiment, the optical feedback assembly 305 forms a field-configurable assembly or stub 405.

In other words, the optical feedback assembly 305 is part of a mechanical configuration that includes one or more fasteners 400. The fasteners 400 in combination with the optical feedback assembly 305 form a detachable waveguide stub 405 that can be optically positioned between a lasing cavity 410 of the laser device 300 and a main fiber (not shown). The main fiber (not shown) may be connected to a multi-channel optical network as described in commonly assigned, U.S. patent application Ser. No. 09/578,777, entitled "Method and System for Increasing a Number of Information Channels Carried by Optical waveguides," filed May 25, 2000, the content of which is hereby incorporated by reference.

The laser device 300 may be a semiconductor laser, such as a Fabry-Perot laser, that has an output which is modulated so as to provide a dense wavelength division multiplexing (DWDM) channel. It is noted that dense wavelength division multiplexing refers to a process where multiple channels of information are propogated at different wavelength regions that can be spaced spectrally at a set wavelength or frequency distance apart from one another. On the other hand, wavelength division multiplexing (WDM) may refer to a process where information channels are propogated at different wavelength regions that are hundreds of nanometers apart. For example, in WDM, an information channel may propagate at the 1310 wavelength region of the optical spectrum while another information channel may propagate at the 1550 nanometer wavelength region of the optical spectrum. For DWDM, information channels can propagate at industry standard spacings that may be on the order of one or two wavelengths or frequencies (or a fraction thereof) apart from one another.

The field configurable assembly 405 is detachable along separation line S from the laser assembly 415. The laser assembly 415 may comprise the laser device 300 in addition to an optical waveguide 420 and a fastener 400. The optical waveguide 420 of the laser assembly 415 is permanently attached to the laser device 300. However, the present invention is not limited to such a permanent assembly as will be discussed with respect to FIG. 5 below.

The field configurable assembly 405 offers significant advantages over conventional feedback assemblies. The laser device 300 and the resultant DWDM information channel can be readily reconfigured to a new operating wavelength region by replacing the field configurable assembly 405 with another field configurable assembly 405 that has a filtering device 310 designed to filter unstabilized light energy at a different predetermined wavelength region. Consequently, changing the operating wavelength region of the laser device 300 can be easily obtained with minimal hardware upgrades. Such construction of the field configurable assembly 405 permits rapid and cost-efficient replacement or switching of parts as well as a way to change operating wavelength regions of convention laser devices in a relatively simple manner.

If a change from one field configurable assembly 405 to another field configurable 405 results in a significant jump in the laser light output wavelength region, then the laser temperature of the laser device 300 can be controlled so as to minimize the pull or energy required between the old and new operating wavelength regions. To regulate the temperature of the laser device 300, a temperature controller similar to the temperature controller 340 of FIG. 3 can be employed.

Figure 5:
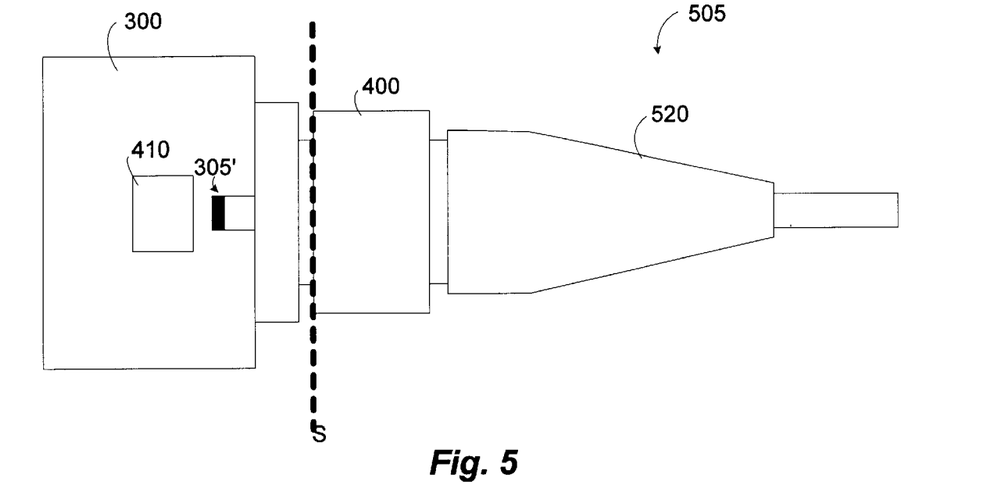
FIG. 5 illustrates an optical feedback assembly according to an alternate exemplary embodiment of the present invention where the optical feedback assembly is positioned at an end portion of an optical waveguide.

FIG. 5 illustrates an optical feedback assembly 305' according to an alternate exemplary embodiment of the present invention where the optical feedback assembly 305' is positioned at an end portion of an optical waveguide 510. Unlike the laser assembly 415 of FIG. 4, the laser assembly 515 of FIG. 5 does not have an optical waveguide permanently attached to the laser device 300. Instead, the optical waveguide 510 which includes the feedback assembly 305' is readily removable with the field configurable assembly 505. The field configurable assembly 505 is detachable along separation line S. The field configurable assembly 505 of FIG. 5 also includes a strain relief section 520. However, the present invention is not limited to the strain relief section 520. Therefore, section 520 can also have standard cross-sectional shapes, such as cylindrical, or a frustum shape in order form a collimating section that collimates light energy therethrough.

The optical feedback assembly 305' of FIG. 5 is preferably an integrated optics package. That is, the filtering device 310 and partial reflecting device 330 can be easily disposed within an optical waveguide or at an end portion of an optical waveguide, such as optical waveguide 510. Positioning the optical feedback assembly 305' facing the lasing cavity 410 increases the ability of the lasing cavity 410 to "lock on" to the predetermined wavelength region that is reflected by the partial reflecting device 330. In other words, the light energy having the predetermined wavelength region reflected by the partial reflecting device 330 into the lasing cavity 410 can permit the laser device 300 to output light energy centered on the predetermined wavelength region. The position of optical feedback assembly 305' of FIG. 5 also permits a single temperature control (not shown) to regulate the temperature of both the lasing cavity 410 and the optical feedback assembly 305' itself The optical feedback assembly 305' comprises the filtering device 310 as well as the partial reflecting device 330. However, the optical feedback assembly 305' forms an integrated optics package that is substantially smaller in physical size relative to the optical feedback assembly 305 of FIG. 4. The integrated optics package can be constructed where the filtering device 310 and partial reflecting device 330 are combined with a planar, or other substrate-based or slab-based waveguide assemblies. Although the feedback assembly 305 and 305' of FIGS. 3–5 is depicted as a waveguide-integrated assembly, the arrangement can be readily incorporated into various free-space architectures.

Figure 6A:
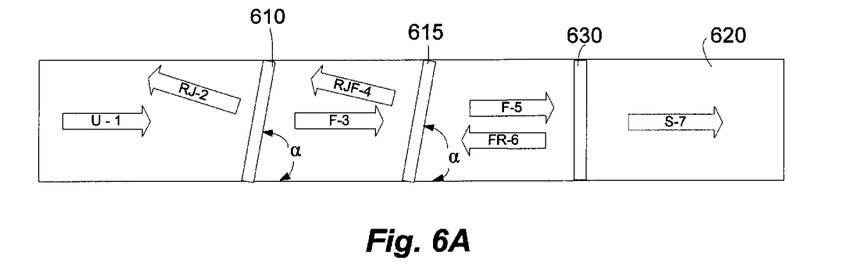
FIG. 6A is a diagram illustrating another exemplary optical feedback assembly according to another exemplary embodiment that can include two filtering devices.

FIG. 6A is a diagram illustrating another exemplary optical feedback assembly 600 according to another exemplary embodiment that can include two filtering devices 610, 615 disposed at angles alpha (α) relative to the longitudinal axis of waveguide 620. The optical feedback assembly 600 may further comprise a partial reflecting device 630 similar to the partial reflecting device 330 illustrated in FIG. 3. The first filtering device 610, and the second filtering device 615, and the partial reflecting device 630 may be disposed within an optical waveguide 620.

In this exemplary embodiment, unstabilized, monochromatic light energy U-1 is directed towards the first filtering device 610. The first filtering device 610 directs rejected light energy RJ-2 having wavelength regions outside of a predetermined wavelength region. The filtering device 610 passes filtered unstabilized monochromatic light energy F-3 towards the second filtering device 615. The second filtering device 615 reflects rejected light energy having wavelength regions outside of the predetermined wavelength region away from the second filtering device 615, outside of the angular propagation limits of the waveguide 620.

Both the first and second filtering devices 610, 615 are disposed at an angle alpha (α) relative to a longitudinal axis of the optical waveguide 620. The second filtering device 615 passes filtered unstabilized monochromatic light energy F-5 to the partial reflecting device 630. The partial reflecting device 630 reflects the unstabilized monochromatic light energy FR-6 back into a laser device (not shown). Next, the laser device (not shown) outputs stabilized monochromatic light energy S-7 centered on the predetermined wavelength region through the first and second filtering devices 610, 615 and through the partial reflecting device 630.

With the exemplary optical assembly 600 of FIG. 6A, advantageous characteristics of light energy generated by a laser device (not shown) can be obtained. The first and second filtering devices 610, 615 are arranged such that resonance between the filters is not sustained. The combination of the first and second filtering devices 610, 615 further narrows the feedback line width of the predetermined wavelength region that is sent back into the laser device (not shown).

Figure 6B:
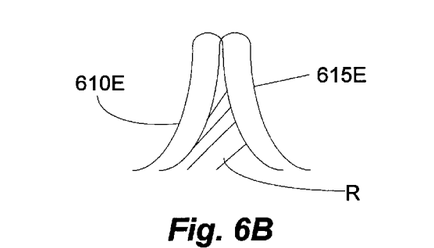
FIG. 6B is an exemplary graph illustrating the combined spectral output of the two filtering devices of FIG. 6A.

FIG. 6B is an exemplary graph illustrating the combined spectral output of the two filtering devices 610, 615 of FIG. 6A. Curve 610E can represent the first predetermined wavelength region that is passed by the filtering device 610. Similarly, curve 615E can represent a second predetermined wavelength region that is passed through the second filtering device 615. Region R denotes the predetermined wavelength region that is a result of the filtering of the first and second filtering devices 610, 615 Region R illustrates that multiple filtering devices can substantially narrow the feedback line of the predetermined wavelength that can be reflected into a laser device. The present invention is not limited to the number or orientation of the filtering devices illustrated in these several figures. Additional or fewer filtering devices may be employed depending upon the predetermined wavelength region that is desired to be produced by the laser device.

Figure 7:
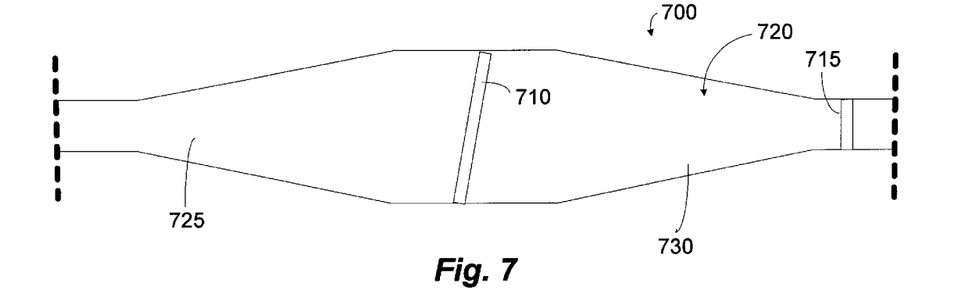
FIG. 7 is a diagram illustrating another exemplary optical feedback assembly according to a further exemplary embodiment including a collimating optical waveguide.

FIG. 7 is a diagram illustrating another optical feedback assembly 700 according to a further exemplary embodiment that includes a collimating optical waveguide 720. The collimating optical waveguide 720 includes an uptapered section 725 as well as a down-tapered section 730. The collimating optical waveguide 720 provides the advantage of minimizing the required angle necessary to preclude back propagation of reflected unstabilized monochromatic light energy that is outside the predetermined wavelength region. The collimating waveguide 720 further minimizes beam divergence during light energy transmission through the multilayer filtering device 710. The partial reflecting device 715 of this embodiment is depicted in a main section of the optical waveguide 720. However, the partial reflecting device 710 may also be placed in the collimated section of either the uptapered 725, down-tapered section 730, or at a position therebetween but as long as the filtering device 710 is disposed between the laser device (not shown) and partial reflecting device 715. The tapered sections 725 and 730 depicted in FIG. 7 are utilized as collimating elements. However, other collimating mechanisms such as grin lenses (as will be discussed with respect to FIG. 9 below) may also be utilized.

Figure 8:
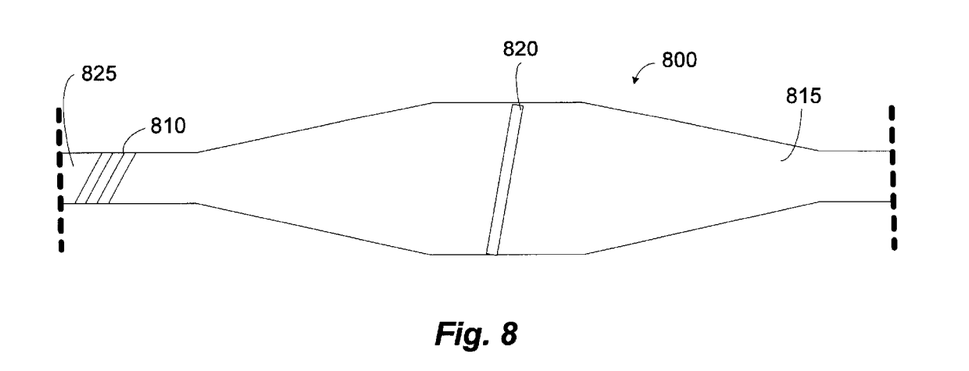
FIG. 8 is a diagram illustrating another optical feedback assembly according to an alternate exemplary embodiment of the present invention that includes a Fiber Bragg grating.

FIG. 8 is a diagram illustrating another optical feedback assembly 800 according to an alternate exemplary embodiment of the present invention that includes a fiber-Bragg grating 710 as the filtering device and partial reflecting device. The Bragg grating 710 may be disposed within or adjacent to an optical waveguide 825. The optical feedback assembly 800 of this embodiment further comprises a guard band filtering device 820. The guard band filtering device 820 isolates a laser device (not shown) from extraneous signals that may be spectrally shifted from the predetermined wavelength region governed by the Bragg grating 810. In a preferred embodiment, the guard band filtering device 820 comprises a thin-film interference filter with a high packing density. Preferably, the packing density of the thin-film interference filter for this embodiment exceeds 95% and more preferably the packing density exceeds 99%. In addition to the guard band filter 820, the optical feedback assembly 800 of this embodiment further comprises an optional collimating optical waveguide 815. However, other optical waveguides having standard cylindrical cross-sections are not beyond the scope of the present invention.

Figure 9:
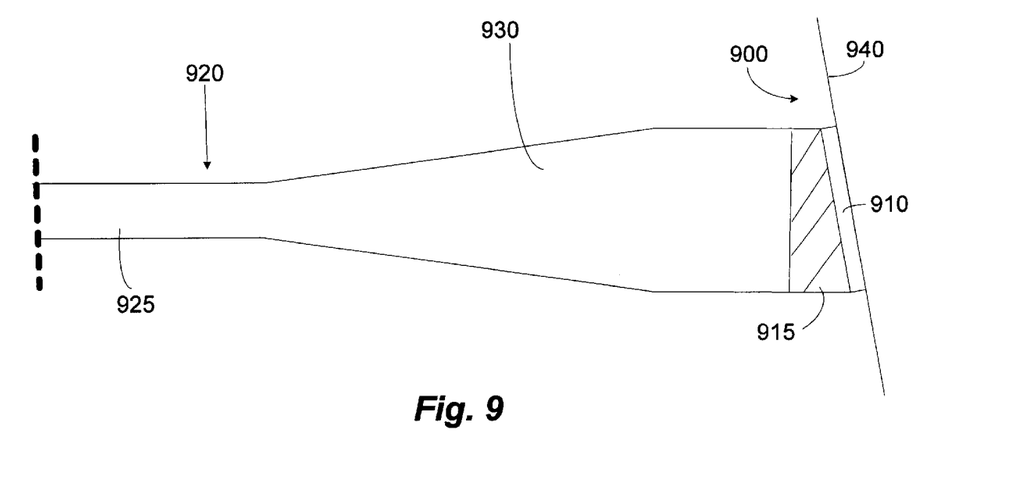
FIG. 9 is a diagram illustrating another optical feedback assembly according to an alternate exemplary embodiment of the present invention that includes a grin lens.

FIG. 9 is a diagram illustrating another optical feedback assembly 900 according to an alternate exemplary embodiment of the present invention that includes a grin lens 915 to collimate light energy as it propagates towards the filtering device 910. In another embodiment (not shown), optical material that is not a waveguide structure can be substituted for the grin lens 915 of FIG. 9.

The optical feedback assembly 900 illustrated in FIG. 9 may further comprise an optical waveguide 920 that includes a substantially cylindrical optical waveguide section 925 positioned adjacent to an uptapered collimating section 930. The optical waveguide section 925 may further comprise a gradient index. The gradient index component improves collimation over the uptapered section 930. The gradient index segment length must be tuned to the angle and distances involved with the optical feedback assembly 900. Preferably, the diameter of the optical waveguide section 925 containing the gradient index matches the diameter of the uptapered section 930 at an end thereof such that alignment of these optical waveguide sections 925, 930 is facilitated. The optical feedback assembly 900 may feed into a planar light guide circuit (PLC) 940.

Figure 10:
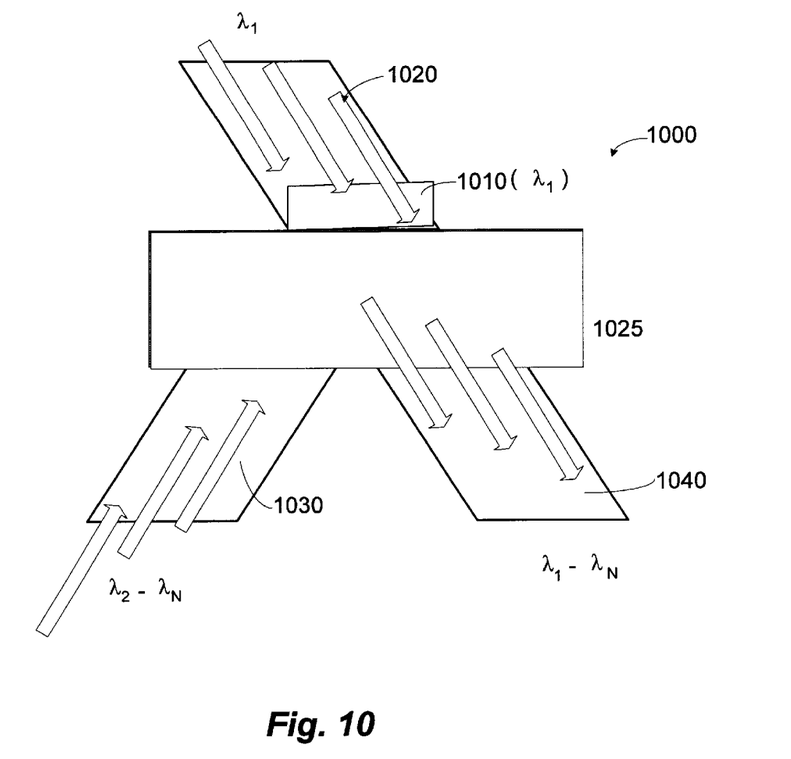
FIG. 10 is a diagram illustrating another optical feedback assembly according to an alternate exemplary embodiment of the present invention that combines the optical feedback assembly with a planar light guide circuit.

FIG. 10 is a diagram illustrating another optical feedback assembly 1000 according to an alternate exemplary embodiment of the present invention that combines the optical feedback assembly 1000 with a planer light guide circuit (PLC) 1025 of an add-multiplexing unit. In this embodiment, information channels operating at predetermined wavelength regions $\lambda_2$–$\lambda_N$ enter PLC 1025 via an optical waveguide 1030 and are combined with an information channel operating at $\lambda_1$ wavelength region. The optical feedback assembly 1000 in this embodiment may comprise a filtering device 1010 as well as an optical waveguide 1020. The filtering device in this embodiment may be attached to either an end face of the optical waveguide 1020 or the planar light guide circuit 1025.

The combined output of the information channels is outputted along an exit optical waveguide 1040. Additional information addressing this general arrangement is described in co-pending, commonly assigned U.S. patent application Ser. No. 09/526,091, entitled "Optical Network Assembly," filed Mar. 15, 2000, the contents of which is hereby incorporated by reference. Other similar architectures of the optical network environment is also described in co-pending, commonly assigned U.S. patent application Ser. No. 09/578,777, entitled "Method and System for Increasing the Number of Information Channels Carried by Optical waveguides," filed Mar. 25, 2000, the entire contents of which is hereby incorporated by reference.

The optical feedback assembly 1000 of FIG. 10 can be utilized in applications such as metropolitan area networking, access networks, high-speed local area networks, Ethernet networks, and other network environments where the data rate requirements are relaxed in comparison to those of conventional long-haul networks. Because of the relaxation and data requirements, some modal dispersion is allowable with the optical feedback assembly 1000 of FIG. 10. Further, some mode disruption is tolerable from the optical elements within the plainer light guide circuit 1025. Collimating elements in this embodiment can also have multi-mode operation.

Figure 11:
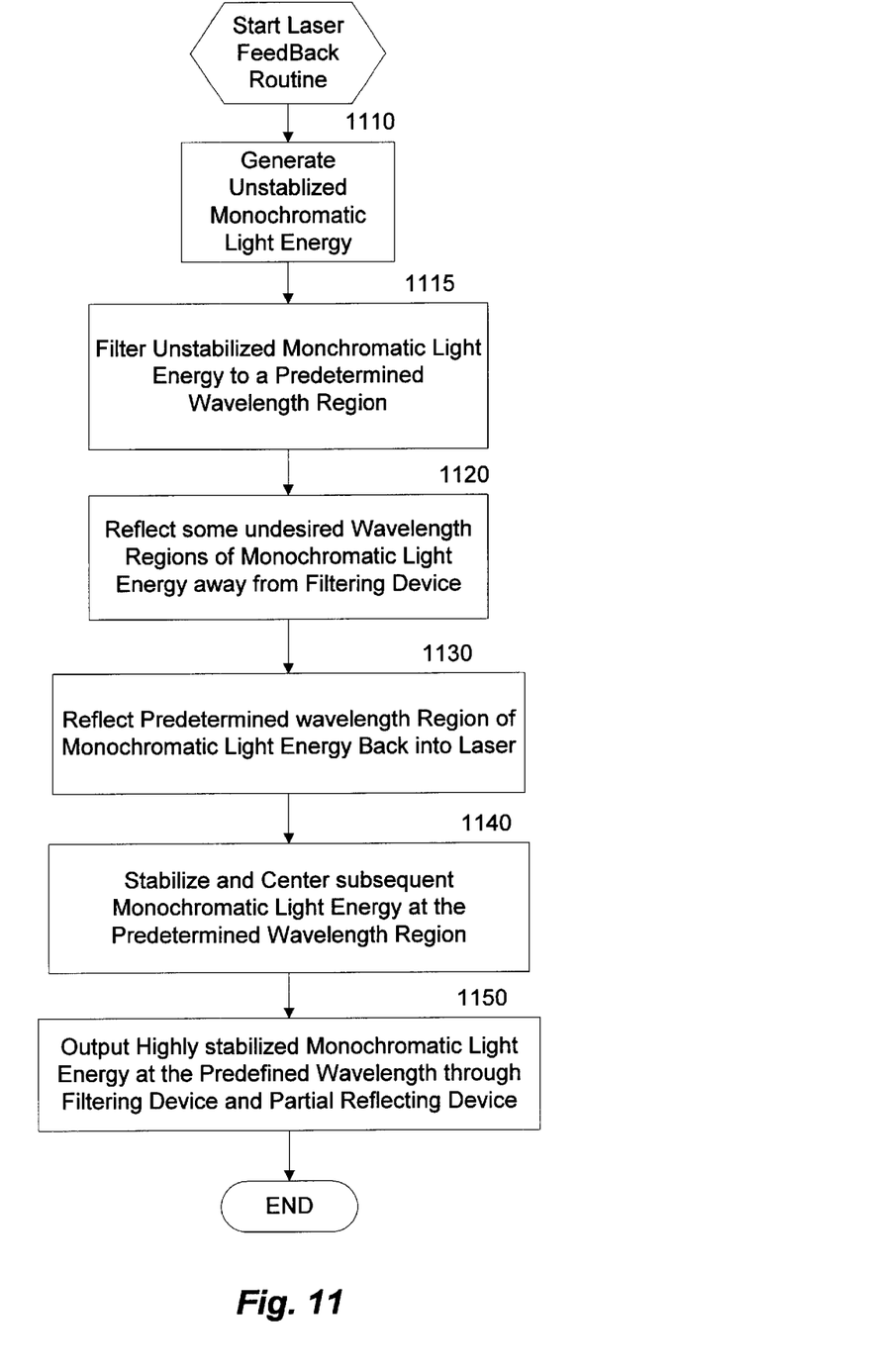
FIG. 11 is a logic flow diagram illustrating a process for stabilizing laser output at a predetermined wavelength region according to the present invention.

FIG. 11 is a logic flow diagram illustrating a process for stabilizing laser output at a predetermined wavelength region according to the present invention. Process 1100 starts with step 1110 in which unstabilized monochromatic light energy is generated by a laser device 300. Next, in step 1115 the unstabilized monochromatic light energy is filtered to a predetermined wavelength region with a filtering device such as filtering device 310 as illustrated in FIG. 3. In step 1120 some of the undesired wavelength regions are reflected at an angle away from the filtering device 310. In step 1130, the monochromatic light energy having the predetermined wavelength region is reflected back into a laser device 300.

Subsequently, in step 1140, the light energy within a lasing cavity 410 of the laser device 300 is stabilized and centered upon the reflected monochromatic light energy at the predetermined wavelength region. Next, in step 1150 the laser device 300 outputs highly stabilized monochromatic light energy at the predetermined wavelength region and is passed through the filtering device 310 and the partial reflecting device 330.

Figure 12:
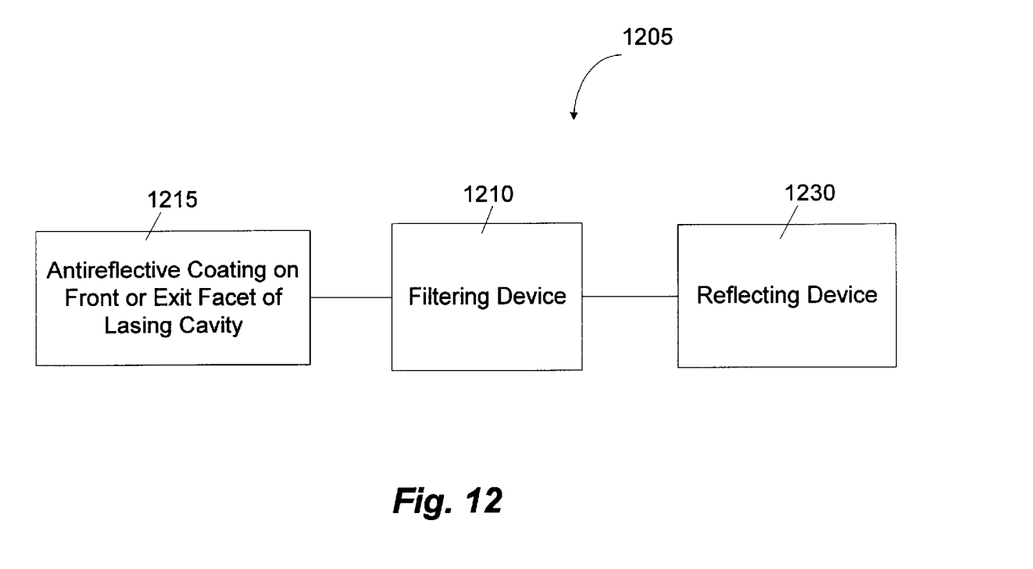
FIG. 12 is a functional block diagram illustrating another optical feedback assembly according to another exemplary embodiment of the present invention that employs an anti-reflective coating on a lasing cavity.

FIG. 12 is a functional block diagram illustrating another optical feedback assembly 1205 according to another exemplary embodiment of the present invention that employs an antireflective coating on a lasing cavity 1210 of a laser device. Specifically, the optical feedback assembly 1205 may further comprise an anti-reflective coating that can be disposed on a front or output facet of a lasing cavity of a laser. An anti-reflective coating disposed on the output facet of the lasing material permits a laser to enhance its output by more readily "locking on" to the light energy of a predetermined wavelength region back reflected through the filtering device 1210 by the partial reflecting device 1230, such as a partial mirror. The filtering device 1210 and partial reflecting device 1230 can comprise any one of the aforementioned filtering devices and partial reflecting devices discussed above.

While the present invention can be employed in optical networks, the invention is not limited to these applications and can be used in other areas that require stabilized monochromatic light energy at predetermined wavelength regions. For example, the present invention may provide a narrow band source for spectroscopy, including Raman spectroscopy and laser induced florescence. The present invention may be further combined with erbium doped fiber amplifiers that may include a pump source. Particularly, the present invention may be combined with such amplifiers for the 1550 nanometer wavelength fiber window of long-haul access networks.

With the present invention, a conventional laser can "lock on" to a predetermined wavelength region to produce highly stabilized monochromatic light energy. The optical feedback assembly of the present invention is readily formed into an integrated optics package such that the filtering device and partial reflecting device can form a single or unitary construction. Such construction enables rapid and cost-efficient replacement or switching of parts. The present invention enables the rapid switching of an operating wavelength region of a conventional laser by simply switching optical feedback assemblies of different predetermined wavelength regions. The present invention also prevents light energy of undesired wavelength regions from passing into a lasing cavity of a laser device during operation. The optical feedback assembly produces highly stabilized monochromatic light energy at very low cost and with little or no modification to conventional lasers since the optical feedback assembly is readily attachable to the laser devices.

It should be understood that the foregoing relates only to the illustrated embodiments of the present invention, and that numerous changes may be made therein without departing from the spirit and scope of the invention that are defined by the following claims.

What is claimed is:

1. An stabilized laser light generation system, comprising:
    a laser for generating unstabilized monochromatic light energy;
    an optical feedback assembly comprising:
        a filtering device, positioned proximate to the laser, for propagating a predetermined wavelength region of the monochromatic light energy therethrough and for reflecting some wavelength regions of the monochromatic light energy outside the predetermined wavelength region; and
        a partial reflecting device, positioned proximate to the filtering device and comprising a Bragg grating, for reflecting the predetermined wavelength region of monochromatic light energy back through the filtering device and into the laser, whereby subsequent monochromatic light energy generated by the laser becomes substantially stabilized within the predetermined wavelength region.

2. The system of claim 1, wherein the stabilized monochromatic light is propagated through the filtering device and the partial reflecting device.

3. The system of claim 1, wherein the filtering device further comprises an interference filter and the partial reflecting device comprises a partial mirror.

4. The system of claim 3, wherein the interference filter is deposited on a grin lens.

5. The system of claim 1, wherein the optical feedback assembly further comprises an optical waveguide, the filtering device being adjacent to or disposed within the optical waveguide, said optical waveguide being coupled to the laser.

6. The system of claim 5, said optical waveguide further comprises a shaped section disposed adjacent to the filtering device for collimating the monochromatic light energy prior to propagating a predetermined wavelength region of the monochromatic light energy through the filtering device.

7. The system of claim 5, wherein the filtering device is disposed at an angle relative to a longitudinal axis of the optical waveguide, the filtering device reflecting undesired wavelength regions of monochromatic light energy with a side of the filtering device opposite to the laser in order to prevent the undesired wavelength regions of monochromatic light energy from propagating into the laser.

8. The system of claim 5, further comprising a fastener attached to the optical waveguide, said fastener being coupled to at least one fastener of the laser.

9. The system of claim 5, wherein the filtering device and partial reflecting device are disposed in the vicinity of an end portion of the optical waveguide.

10. The system of claim 1, wherein the laser comprises a lasing cavity having an antireflective coating disposed on an output facet thereof.

11. The system of claim 1, wherein the optical feedback assembly further comprises an optical waveguide, said filtering device and said partial reflecting device are adjacent to or disposed within said optical waveguide, said partial reflecting device is disposed adjacent to the filtering device, and said optical waveguide is coupled to the laser.

12. The system of claim 1, wherein said filtering device and said partial reflecting device form a unitary structure, said unitary structure being coupled to one of the laser and an optical waveguide.

13. The system of claim 12, wherein said unitary structure has a wedge shape.

14. The system of claim 1, wherein said laser comprises a semiconductor laser.

15. The system of claim 1, wherein said monochromatic light energy is modulated in order to produce a dense wavelength region division multiplexing channel.

16. The system of claim 1, further comprising a temperature controller for adjusting a temperature at which the monochromatic light energy is generated in order to narrow the modal wavelength region distribution of the monochromatic light energy prior to stabilization.

17. The system of claim 1, wherein said filtering device is a first filtering device, the predetermined wavelength region is a first predetermined wavelength region, and the band of wavelength regions is a first band of wavelength regions, the optical feedback assembly further comprising a second filtering device for propagating a second predetermined wavelength region therethrough, for reflecting a second band of wavelength regions of the monochromatic light energy outside the predetermined wavelength region away from the second filtering device.

18. The system of claim 1, further comprising an optical add/drop multiplexing unit, said filtering device being disposed within said add/drop multiplexing unit.

19. An stabilized laser light generation system comprising:
    a laser for generating monochromatic light energy;
    an optical feedback assembly comprising:
        a Bragg grating, positioned proximate to the laser, for propagating a predetermined wavelength region of the monochromatic light energy therethrough, for reflecting the predetermined wavelength region of monochromatic light energy into the laser; and
        a filtering device, positioned proximate to the Bragg grating, for isolating the predetermined wavelength region of monochromatic light energy from extraneous light energy, whereby subsequent monochromatic light energy generated by the laser becomes substantially stabilized within the predetermined wavelength region.

20. The system of claim 19, wherein said Bragg grating is positioned between the laser and the filtering device.

21. The system of claim 19, the optical feedback assembly further comprising an optical waveguide, said Bragg grating being operatively coupled to said optical waveguide, said filtering device being position adjacent to or within said optical waveguide, said optical waveguide being coupled to a semiconductor laser.

22. The system of claim 21, wherein said optical waveguide further comprises a shaped section for collimating the extraneous light energy directed towards said filtering device.

23. An optical feedback assembly, comprising:
    a filtering device having a first contiguous spectral region for propagating a first predetermined wavelength region of light energy therethrough, for reflecting second and third predetermined wavelength regions of the light energy away from the filtering device, said first wavelength region being spectrally disposed between said second and third predetermined wavelength regions, said filtering device being positioned within an optical pathway at an oblique angle relative to a longitudinal axis of said optical pathway; and a partial reflecting device having a second contiguous spectral region for reflecting a first portion of incident light energy and for transmitting a second portion of the incident light energy, said partial reflecting device being positioned within said optical pathway at an substantially perpendicular angle relative to a longitudinal axis of said optical pathway, whereby filtered and reflected incident light energy propagates through said filtering device, wherein at least one of said filtering device and said partial reflecting device comprise a Bragg grating.

24. The assembly of claim 23, wherein said optical pathway comprises a part of an optical communications network.

25. The assembly of claim 24, wherein said optical communications network comprises DWDM information channels.

26. The assembly of claim 23, wherein said optical pathway comprises an optical fiber.

27. The assembly of claim 23, wherein said optical pathway comprises a planar light guide circuit.

28. The assembly of claim 23, wherein said optical pathway comprises a semiconductor gain medium of a laser device.

29. The assembly of claim 23, wherein said second contiguous spectral region of said reflecting device includes said first contiguous spectral region of said filtering device.

30. The assembly of claim 23, wherein said filtering device transmits at least eighty-five percent of light energy propagating at said first predetermined wavelength region.

31. The assembly of claim 23, wherein said filtering device comprises a thin-film interference filter with a packing density exceeding ninety five percent.

32. The assembly of claim 23, wherein said filtering device comprises an oxide material.

33. The assembly of claim 23, wherein said filtering device is integrated with a planar light guide circuit.

34. The assembly of claim 23, wherein said reflecting device reflects light energy into a semiconductor laser in order to stabilize laser output within said first predetermined wavelength region.

35. The assembly of claim 23, wherein said partial reflecting device comprises a dielectric filter.

36. The assembly of claim 23, wherein said partial reflecting device has an optical efficiency such that the sum of the reflected portion of the incident light and the transmitted portion of the incident light exceeds eighty percent of the total incident light.

37. A method for stabilizing laser output, comprising the steps of:

generating unstabilized monochromatic light energy with a laser;

filtering the unstabilized monochromatic light energy with a filtering device to generate a predetermined wavelength region of the monochromatic light energy;

reflecting wavelength regions of the monochromatic light energy outside the predetermined wavelength region and away from the filtering device; and reflecting the predetermined wavelength region of monochromatic light energy back through the filtering device and into the laser with a partial reflecting device, whereby subsequent monochromatic light energy generated by the laser becomes substantially stabilized within the predetermined wavelength region, wherein at least one of the filtering device and the partial reflecting device comprise a Bragg grating.

38. The method of claim 37, further comprising the steps of:

propagating stabilized monochromatic light energy through the filtering device; and propagating stabilized monochromatic light energy through the partial reflecting device.

39. The method of claim 38, wherein the filtering device comprises an interference filter and the partial reflecting device comprises a partial mirror.

40. The method of claim 39, further comprising the step of depositing the interference filter on a grin lens.

41. The method of claim 37, further comprising the steps of:

positioning the filtering device within an optical waveguide; and coupling the optical waveguide to the laser.

42. The method of claim 37, wherein the laser comprises a lasing cavity, the method further comprising the step of applying an antireflective coating to an output facet of the lasing cavity.

43. The method of claim 37, further comprising the step of collimating the monochromatic light energy prior to propagating a predetermined wavelength region of the monochromatic light energy through the filtering device.

44. The method of claim 37, further comprising the steps of:

positioning the filtering device at an angle relative to a longitudinal axis of the optical waveguide; and reflecting undesired wavelength regions of monochromatic light energy with a side of the filtering device opposite to the laser in order to prevent the undesired wavelength regions of monochromatic light energy from propagating into the laser.

45. The method of claim 37, further comprising the steps of:

positioning the filtering device within an optical waveguide;

positioning the partial reflecting device within the optical waveguide adjacent to the filtering device; and coupling the optical waveguide to the laser.

46. The method of claim 37, further comprising the steps of:

forming the filtering device and the partial reflecting device as a unitary structure; and coupling the unitary structure to one of the laser and an optical waveguide.

47. The method of claim 37, further comprising the step of shaping the unitary structure as a wedge.

48. The method of claim 37, further comprising the steps of:

attaching a fastener to the optical waveguide; and coupling the fastener of the optical waveguide to a fastener of the laser.

49. The method of claim 37, wherein the predetermined wavelength region is a first predetermined wavelength region, the method further comprising the step of adjusting an operating wavelength region of the laser from the first predetermined wavelength region to a second predetermined wavelength region by changing the filtering device.

50. The method of claim 37, wherein the predetermined wavelength region is a first predetermined wavelength region, the method further comprising the step of:

positioning a first filtering device within a first optical waveguide; and coupling the first optical waveguide to the laser; and adjusting an operating wavelength region of the laser from the first predetermined wavelength region to a second predetermined wavelength region by coupling a second optical waveguide containing a second filtering device to the laser.

51. The method of claim 37, further comprising the steps of:

positioning the filtering device on an end portion of an optical waveguide; and coupling the optical waveguide to the laser.

52. The method of claim 51, further comprising the steps of:

positioning the filtering device at an angle relative to a longitudinal axis of the optical waveguide; and reflecting undesired wavelength regions of monochromatic light energy with a side of the filtering device opposite to the laser in order to prevent the undesired wavelength regions of monochromatic light energy from propagating into the laser.

53. The method of claim 37, wherein the step of generating monochromatic light energy further comprises generating monochromatic light energy with a semiconductor laser.

54. The method of claim 37, further comprising the step of modulating the monochromatic light energy in order to produce a dense wavelength region division multiplexing channel.

55. The method of claim 37, further comprising the step of adjusting a temperature at which the monochromatic light energy is generated in order to narrow the modal wavelength region distribution of the monochromatic light energy prior to stabilization.

56. The method of claim 37, wherein the predetermined wavelength region is a first predetermined wavelength region, the filtering device is a first filtering device, and the band of wavelength regions is a first band of wavelength regions, the method further comprising the steps of:

propagating the first predetermined wavelength region of the monochromatic light energy towards the second filtering device;

reflecting at least some wavelength region of the monochromatic light energy outside a second predetermined wavelength region away from the second filtering device; and reflecting the second predetermined wavelength region of monochromatic light energy back through the filtering devices and into the laser.

57. The method of claim 37, further comprising the step of combining the predetermined wavelength region of light energy with a plurality of predetermined wavelength regions of light energy in order to form an add/drop multiplexing function.

58. A method for stabilizing laser output comprising the steps of:

generating unstabilized monochromatic light energy with a laser;

propagating the monochromatic light energy towards a Bragg grating;

reflecting a predetermined wavelength region of monochromatic light energy into the laser; and isolating the predetermined wavelength region of monochromatic light energy from extraneous light energy with a filtering device, whereby subsequent monochromatic light energy generated by the laser becomes substantially stabilized within the predetermined wavelength region.

59. The method of claim 58, further comprising the step of positioning the Bragg grating between the laser and the filtering device.

60. The method of claim 58, further comprising the steps of:

positioning the Bragg grating and filtering device within an optical waveguide; and coupling the optical waveguide to a semiconductor laser.

61. The method of claim 58, further comprising the step of collimating the extraneous light energy before isolating the predetermined wavelength region of monochromatic light energy from extraneous light energy.

* * * * *